United States Patent
Wang

(10) Patent No.: US 7,538,435 B2
(45) Date of Patent: May 26, 2009

(54) WAFER STRUCTURE AND BUMPING PROCESS

(75) Inventor: Jiunheng Wang, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 11/314,780

(22) Filed: Dec. 19, 2005

(65) Prior Publication Data
US 2007/0141824 A1      Jun. 21, 2007

(51) Int. Cl.
*H01L 29/72* (2006.01)
*H01L 23/48* (2006.01)

(52) U.S. Cl. ............ 257/758; 257/737; 257/738; 257/773; 257/E21.508; 257/E23.021; 438/612; 438/614; 438/618; 438/643

(58) Field of Classification Search .......... 257/737, 257/738, 758, 773
See application file for complete search history.

(56) References Cited

U.S. PATENT DOCUMENTS

| | | | | |
|---|---|---|---|---|
| 6,293,457 B1 * | 9/2001 | Srivastava et al. | ............ | 228/254 |
| 6,452,270 B1 * | 9/2002 | Huang | ............ | 257/738 |
| 6,958,546 B2 * | 10/2005 | Fan et al. | ............ | 257/773 |
| 7,355,282 B2 * | 4/2008 | Lin et al. | ............ | 257/758 |
| 2002/0121692 A1 * | 9/2002 | Lee et al. | ............ | 257/737 |
| 2005/0285116 A1 * | 12/2005 | Wang | ............ | 257/76 |

* cited by examiner

*Primary Examiner*—Dao H Nguyen
(74) *Attorney, Agent, or Firm*—J.C. Patents

(57) ABSTRACT

A wafer structure including a semiconductor substrate, elastic elements, under bump metallurgic (UBM) layers and bumps is provided. The semiconductor substrate has an active surface, and it includes pads disposed on the active surface. The elastic elements are disposed on the pads respectively. Each elastic element has an opening, such that a portion of each pad is exposed from the opening of the corresponding elastic element. The UBM layers cover the elastic elements respectively, and each UBM layer is connected to the corresponding pad. The bumps are disposed on the UBM layers respectively.

10 Claims, 9 Drawing Sheets

WAFER STRUCTURE AND BUMPING PROCESS

BACKGROUND OF THE INVENTION

1. Field of the Invention

The present invention generally relates to a wafer structure and a bumping process, in particular, to a wafer structure and a bumping process for releasing the pressure exerted on bumps.

2. Description of Related Art

Recently, the flat display device having advantages of higher image quality, optimal space efficiency, low power and non-radiation is broadly used in medium or small-sized portable televisions, cell phones, camcorders, notebook computers, desktop computers, projection-type televisions and other computer products. Therefore, the flat display device has replaced the conventional cathode ray tube (CRT) and become the main stream on the market. In general, after the fabrication process of the flat display device is completed, there is a need to perform a chip on glass (COG) process, such that the flat display device can be electrically connected to external systems though some chips, to provide power or driving signals to the flat display device.

FIG. 1 is a schematic cross-sectional view showing a flat display device and a chip when performing a COG process. Please refer to FIG. 1, a chip 200 is disposed on a flat display device 100, wherein the bumps 202 of the chip 200 are aligned with the bonding pads 102 of the flat display device 100. After that, the chip 200 and the flat display device 100 are heated and pressed, so as to bond the bumps 202 and the bonding pads 102 together. However, too much bonding force applied to the chip 200 and the flat display device 100 during the COG process may damage the chip 200, the flat display 100 and the electrical connection between them. Therefore, a compliant bump is provided to solve the foregoing problem.

FIG. 2 is a schematic cross-sectional view showing a conventional compliant bump. Please refer to FIG. 2, a substrate 300 comprises a plurality of pads 310 disposed on its active surface S and a solder mask layer 320 exposing a portion of the pads 310. A plurality of under bump metallurgy (UBM) layers 330 are disposed on the solder mask layer 320 and contact the exposed pads 310 respectively; a plurality of compliant bumps 340 are disposed on the UBM layers 330 respectively.

Each compliant bump 340 comprises a polymer material 340a and a metal shell 340b enclosing the polymer material 340a. In general, the polymer material 340a is polyimide. However, if water or solvent remains in the polymer material 340a enclosed by the metal shell 340b after the fabrication process of the compliant bumps 340 is completed, the compliant bumps 340 may expand, crack or deform when heated. This may damage the electrical connection between the substrate 300 and other devices.

SUMMARY OF THE INVENTION

Accordingly, one purpose of the present invention is to provide a wafer structure which utilizes the elastic elements for releasing the pressure exerted on the bumps when a bonding process is performed.

A second purpose of the present invention is to provide a bumping process which utilizes the elastic elements formed between the substrate and the bumps, to make sure the electrical connection between the wafer structure and other chips or devices.

As embodied and broadly described herein, the present invention provides a wafer structure comprising a semiconductor substrate, a plurality of elastic elements, a plurality of under bump metallurgic (UBM) layers and a plurality of bumps. The semiconductor substrate has an active surface, and it comprises a plurality of pads disposed on the active surface. The elastic elements are disposed on the pads respectively. Each elastic element has an opening, such that a portion of each pad is exposed from the opening of the corresponding elastic element. The UBM layers cover the elastic elements respectively, and each UBM layer is connected to the corresponding pad. The bumps are disposed on the UBM layers respectively.

According to one embodiment of the present invention, a material of the elastic elements comprises a polymer material. More specifically, the polymer material is polyimide.

According to one embodiment of the present invention, the wafer structure further comprises a passivation layer disposed on the active surface of the semiconductor substrate. The passivation layer is disposed between the pads and the elastic element, and has a plurality of openings for exposing the pads.

As embodied and broadly described herein, the present invention also provides a bumping process comprising the following steps. First, a semiconductor substrate having a plurality of pads disposed on an active surface thereof is provided. Next, an elastic element is formed on each pad. Each elastic element has an opening, such that a portion of each pad is exposed from the opening of the corresponding elastic element. Thereafter, an UBM layer is formed on each elastic element, wherein each UBM layer is connected to the corresponding pad. Finally, a bump is formed on each UBM layer.

According to one embodiment of the present invention, after the semiconductor substrate is provided, the method further comprises a step of forming a passivation layer on the active surface of the semiconductor substrate. The passivation layer has a plurality of openings for exposing the pads.

According to one embodiment of the present invention, the method of forming the elastic element comprises the following steps. First, a photo-sensitive material is formed on the semiconductor substrate. Then, the photo-sensitive material is patterned by using a photolithography process, to form the elastic elements disposed on the pads respectively.

According to one embodiment of the present invention, the method of forming the bump comprises printing and electroplating.

In summary, the present invention utilizes the elastic elements disposed between the active surface of the semiconductor substrate and the bump, to release the pressure exerted on the bump when a bonding process is performed. Besides, if a particle exists between the bumps and other chips or devices, the bumps can still contact other chips or devices by the deformation (such as compression and expansion) of the elastic element, to further make sure the electrical connection between the wafer structure and other chips or devices.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
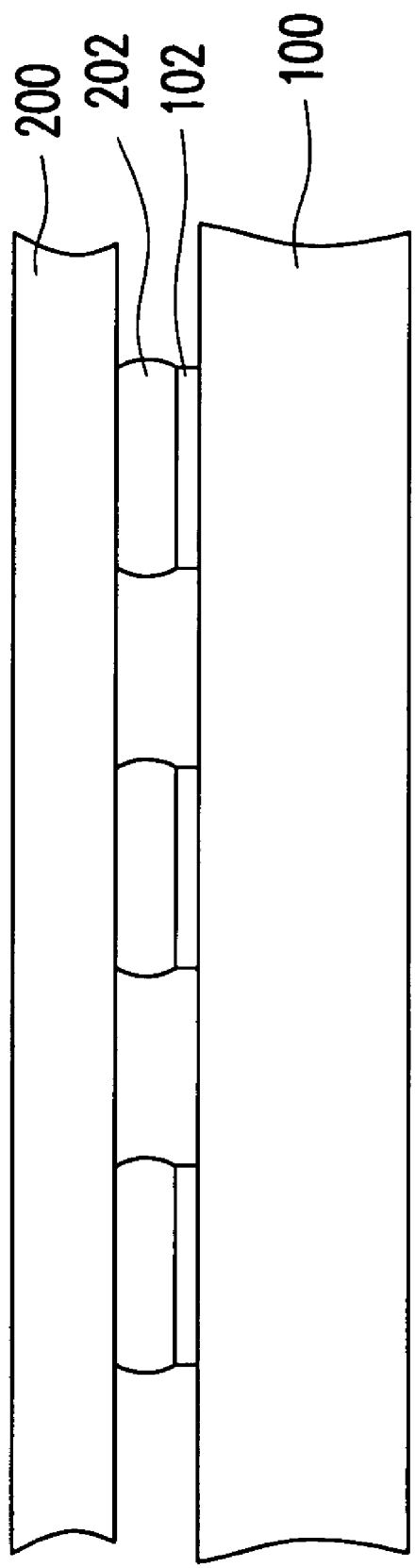
FIG. 1 is a schematic cross-sectional view showing a flat display device and a chip when performing a COG process.
Figure 2:
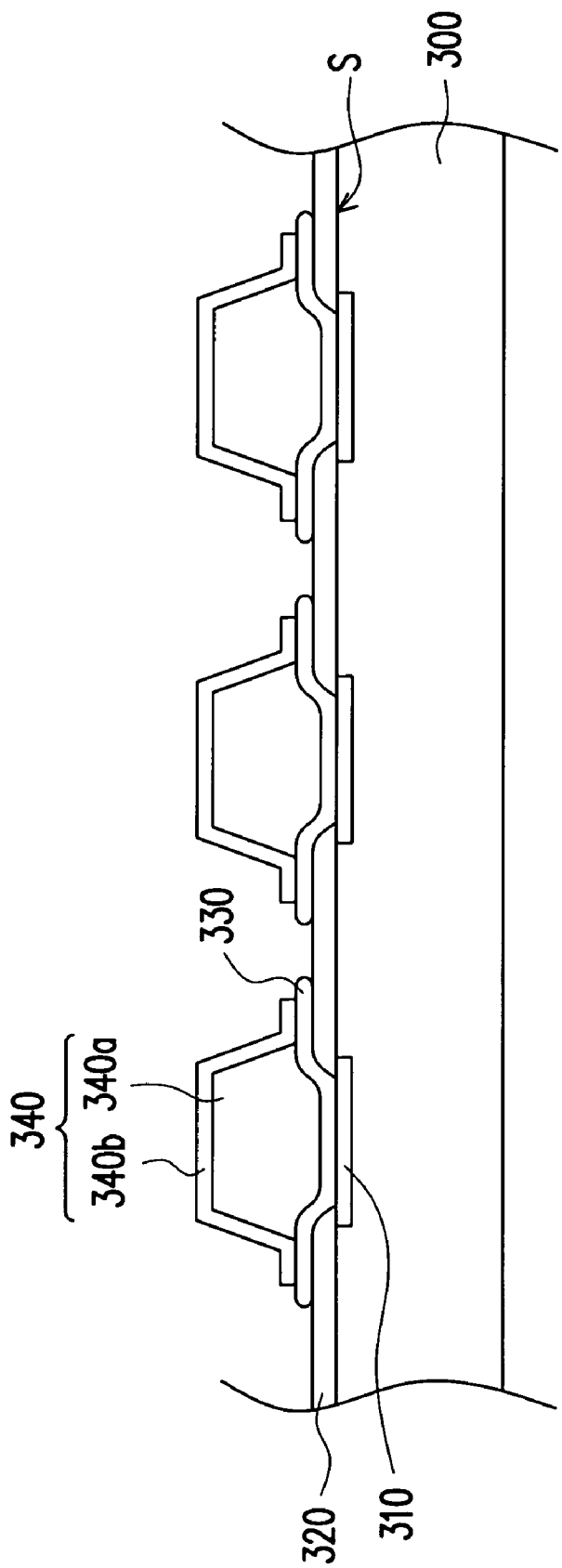
FIG. 2 is a schematic cross-sectional view showing a conventional compliant bump.

Reference will now be made in detail to the present preferred embodiments of the invention, examples of which are illustrated in the accompanying drawings. Wherever possible, the same reference numbers are used in the drawings and the description to refer to the same or like parts.

Figure 3:
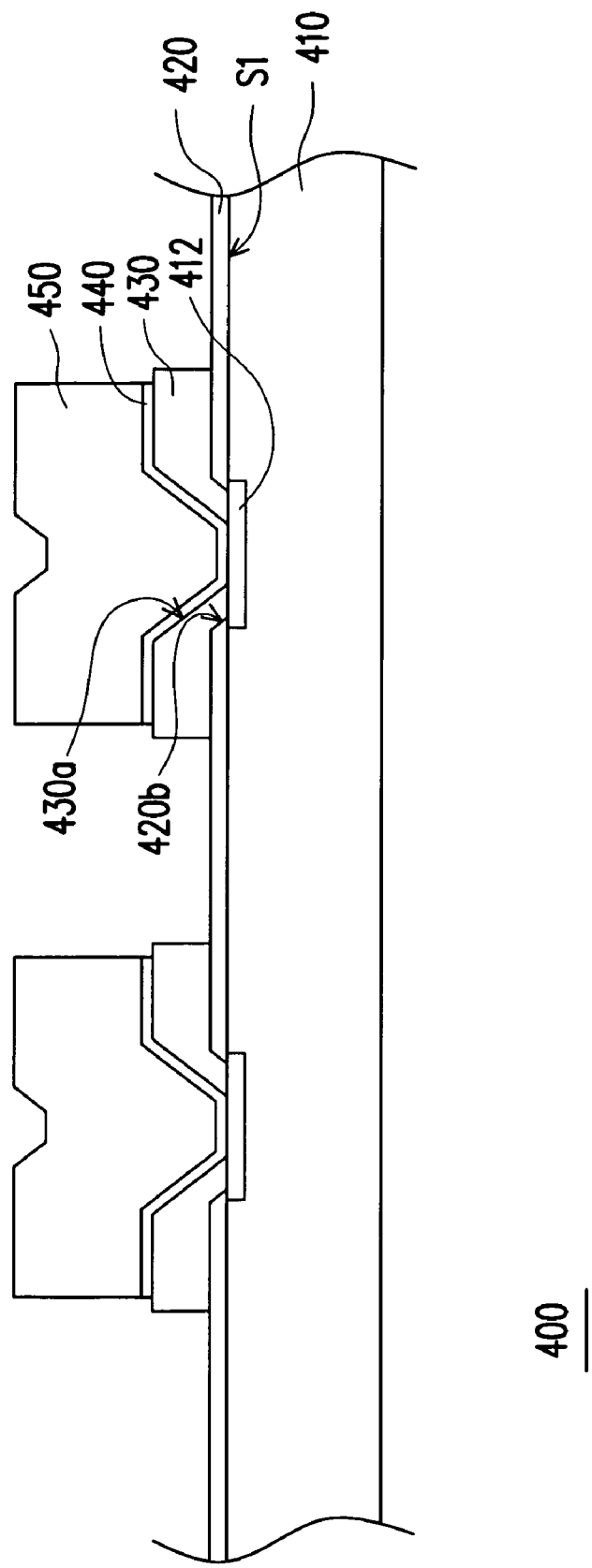
FIG. 3 is a schematic cross-sectional view showing a wafer structure according to an embodiment of the present invention.

FIG. 3 is a schematic cross-sectional view showing a wafer structure according to an embodiment of the present invention. Please refer to FIG. 3, the wafer structure 400 mainly comprises a semiconductor substrate 410, a plurality of pads 412, a passivation layer 420, a plurality of elastic elements 430, a plurality of UBM layers 440 and a plurality of bumps 450. The semiconductor substrate 410 has an active surface S1, and it comprises a plurality of semiconductor devices (not shown) and a plurality of pads 412 disposed on the active surface S1. In one embodiment of the present invention, the semiconductor substrate 410 is a silicon wafer for example, and the devices (not shown) formed by semiconductor process are disposed on its active surface S1 and are electrically connected to other chips or devices through the pads 412. A material of the pads 412 comprises copper, aluminum or other conductive material. The passivation layer 420 is selectively disposed on the active surface S1 of the semiconductor substrate 410 for protecting the devices formed thereon, and it has a plurality of openings 420a for exposing the pads 412. A material of the passivation layer 420 comprises a inorganic material, such as silicon dioxide, silicon nitride and phosphosilicate glass (PSG), or an organic material, such as polyimide.

The elastic elements 430 are disposed on the pads 412 respectively. Each elastic element 430 has an opening 430a, such that a portion of each pad 412 is exposed from the opening 430a of the corresponding elastic element 430. The elastic elements 430 are made of elastic material. Therefore, when the wafer structure 400 is bonded with other chips or devices, the elastic elements 430 are able to release the pressure exerted on the bump 450. In one embodiment of the present invention, the elastic elements 430 are made of a polymer material, such as polyimide. The height of the elastic elements 430 counting from the top surface of the passivation layer 420 can be higher than, equal to or lower than the height of the bumps 450 counting from the top surface of the passivation layer 420 as well. However, it is better that the height of the elastic elements 450 is 1/3 the height of the bumps 450.

The UBM layers 440 cover the elastic elements 430 respectively. Each UBM layer 440 is connected to the corresponding pad 412 through the opening 430a. In general, the UBM layer 440 comprises an adhesive layer, a barrier layer and a wetting layer. The adhesive layer is disposed on the elastic element 430; the barrier layer is disposed on the adhesive layer; the wetting layer is disposed on the barrier layer. The bumps 450 are disposed on the UBM layers 440 respectively. The bumps 450 can be gold bumps, solder bumps, lead-free bumps or other types of bumps. The pads 412 of the wafer structure 400 are electrically connected to other chips or devices through the bumps 450.

A bumping process for fabricating the foregoing elastic elements and bumps is illustrated in the following. FIGS. 4A to 4E are schematic, cross-sectional diagrams illustrating the process flow of a bumping process of the present invention. First, please refer to FIG. 4A, a semiconductor substrate 410 having a plurality of pads 412 disposed on an active surface S1 of the semiconductor substrate 410 is provided. Next, please refer to FIG. 4B, a passivation layer 420 is selectively formed on the active surface S1 of the semiconductor substrate 410, and the passivation layer 420 has a plurality of openings 420a for exposing each pad 412. After, please refer to FIG. 4C, an elastic element 430 is formed on each pad 412. Each elastic element 430 has an opening 430a, such that a portion of each pad 412 is exposed from the opening 430a of the corresponding elastic element 430. More specifically, the elastic elements 430 are formed by the following steps. First, a photo-sensitive material is formed on the wafer completely, and then the photo-sensitive material is patterned by a photolithography process to form the elastic elements 430 disposed on the pads 412 respectively.

Figure 4A:
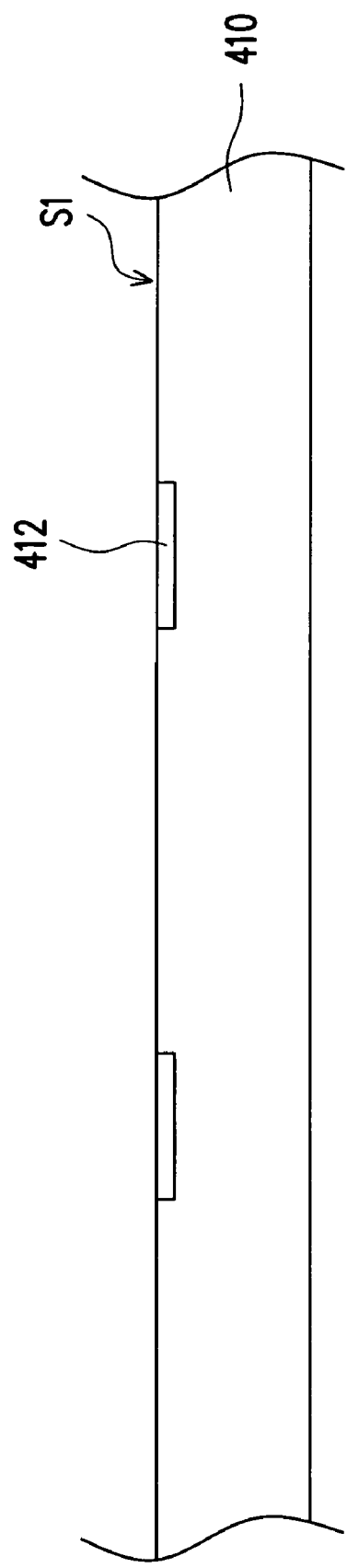
FIGS. 4A to 4E are schematic, cross-sectional diagrams illustrating the process flow of a bumping process of the present invention.
Figure 4B:
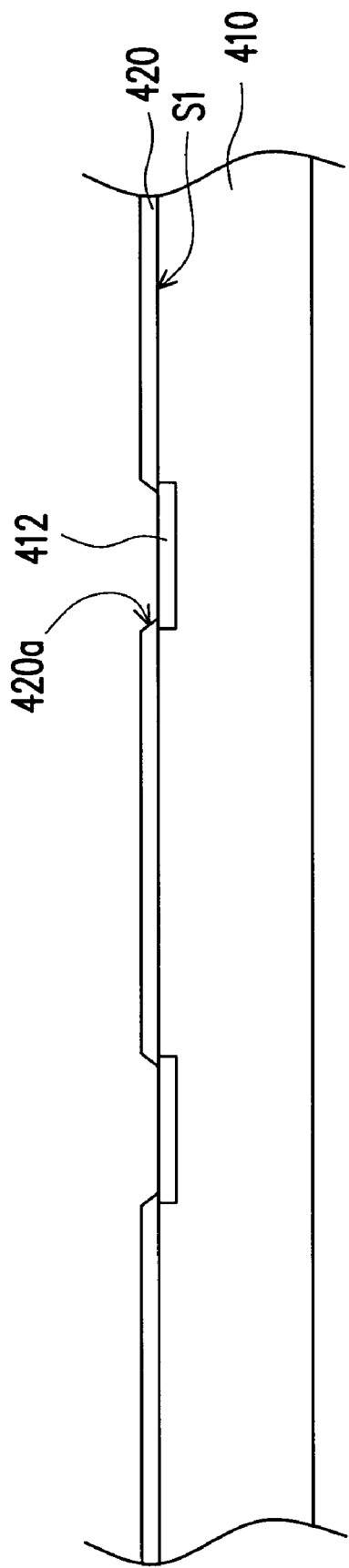
Figure 4C:
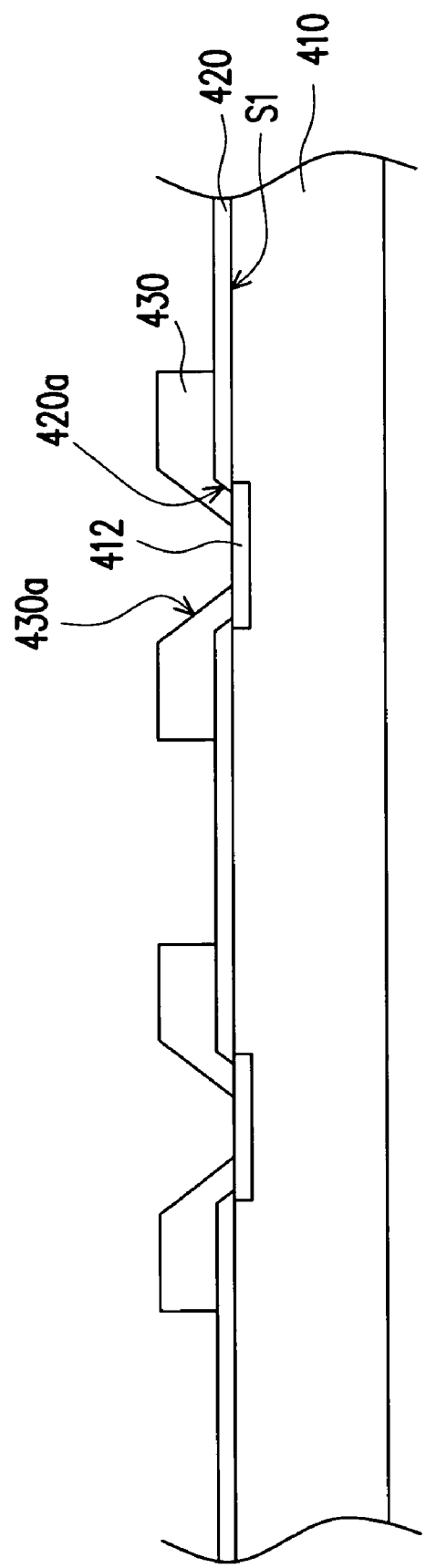
Figure 4D:
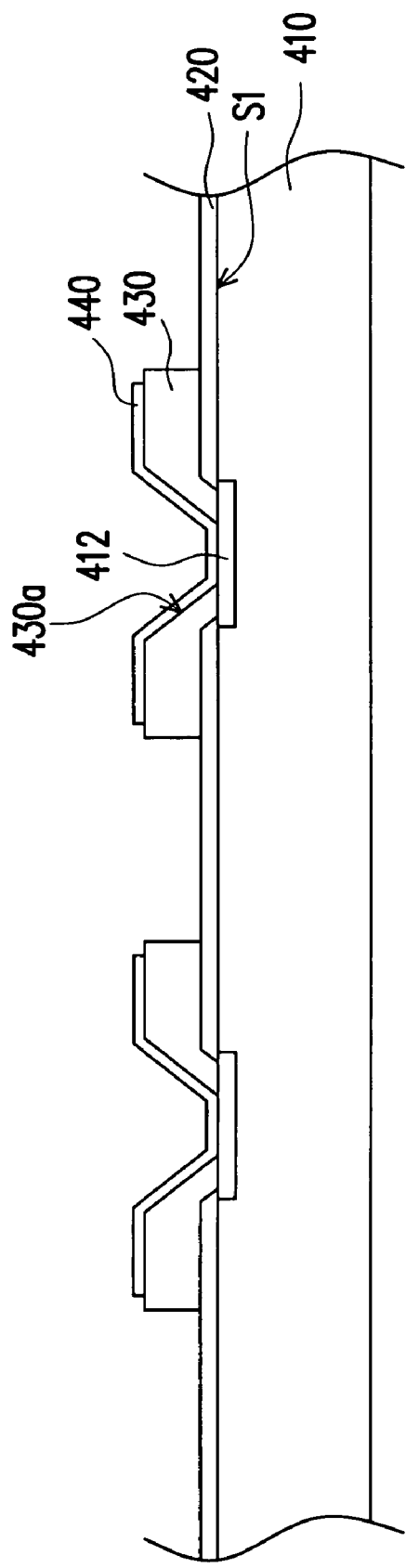
Figure 4E:
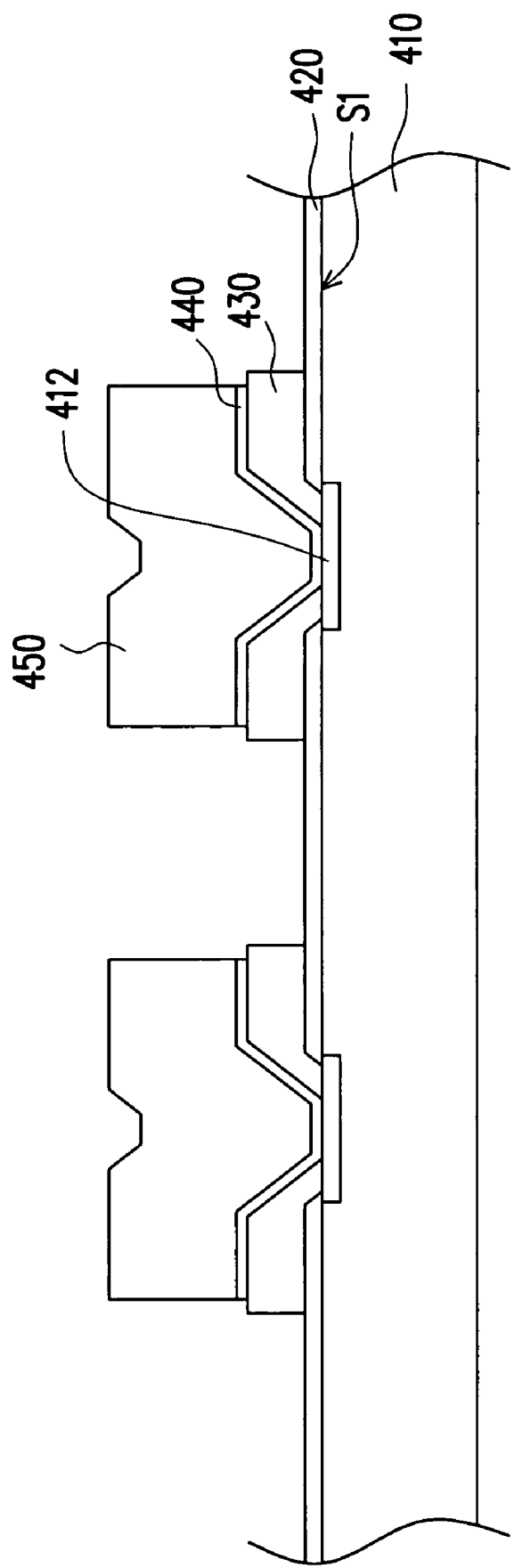

Thereafter, please refer to FIG. 4D, an UBM layer 440 is formed on each elastic element 430, and each UBM layer 440 is connected to the corresponding pad 412 through the opening 430a. Finally, please refer to FIG. 4E, a bump 450 is formed on each UBM layer 440. The bumps 450 can be formed by printing, plating or other method, and the bumps 450 can be gold bumps, solder bumps, lead-free bumps or other types of bumps.

Figure 5:
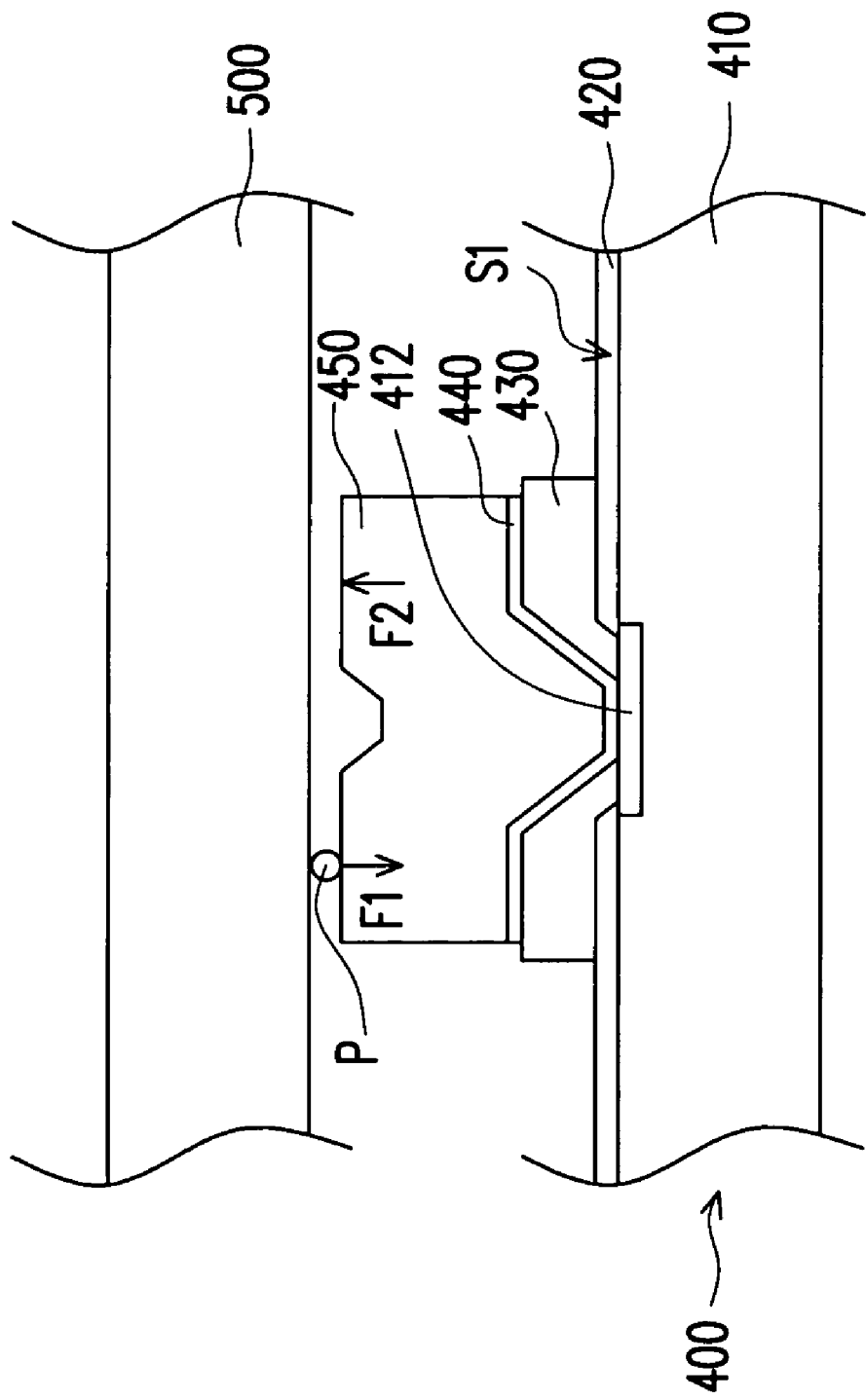
FIG. 5 is a schematic cross-sectional view showing a particle existing between the bump and a glass substrate when a bonding process is performed.

FIG. 5 is a schematic cross-sectional view showing a particle existing between the bump and a glass substrate when a bonding process is performed. Please refer to FIG. 5, when the semiconductor substrate 410 is bonded with a glass substrate 500 or a rigid substrate, if a particle P exists between the bump 450 and the glass substrate 500, a downward force F1 is exerted on the left hand side of the bump 450 and the elastic element 430, and the left hand side of the elastic element 430 is compressed. This would cause the right hand side of the elastic element 430 expand upwards, and the upward force F2 would make the right hand side of the bump 450 move upward and contact with the glass substrate 500, to make sure the electrical connection between the semiconductor substrate 410 and the glass substrate 500.

In summary, the elastic elements are disposed between the active surface of the semiconductor substrate and the bump in the present invention. When the wafer structure is bonded with other chips or devices, the elastic elements are adapted for releasing the pressure exerted on the bumps. Besides, if a particle exists between the bumps and other chips or devices, the bumps can still contact other chips or devices by the deformation of the elastic element, to further make sure the electrical connection between the wafer structure and other chips or devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer structure, comprising:
   a semiconductor substrate having an active surface, wherein the semiconductor substrate comprising a plurality of pads disposed on the active surface;

a passivation layer, disposed on the active surface of the semiconductor substrate, having a plurality of openings for exposing the pads;

a plurality of elastic elements disposed on the pads respectively and also on the passivation layer, wherein each elastic element has an opening, such that a portion of each pad is exposed from the opening of the corresponding elastic element, and the elastic elements are separated from each other;

a plurality of under bump metallurgic layers covering the elastic elements respectively, wherein each under bump metallurgic layer is connected to the corresponding pad;

a plurality of bumps, having a flat surface portion, disposed on the under bump metallurgic layers respectively; and a rigid substrate, pressed on a contact area of the bumps, wherein each of the elastic elements ensures the contact area of each of the bumps for contacting the rigid substrate by an elastic deformation, wherein a height of the elastic elements counting from a top surface of the passivation layer is substantially at least $1/3$ of a height of the bumps counting from the top surface of the passivation layer as well.

2. The wafer structure according to claim 1, wherein a material of the elastic elements comprises a polymer material.

3. The wafer structure according to claim 2, wherein the polymer material is polyimide.

4. The wafer structure according to claim 1, wherein a particle exists between the bump and the rigid substrate, the elastic element ensures the contact area for contacting the rigid substrate by the elastic deform.

5. The wafer structure according to claim 1, wherein the bumps are plated bumps or printed bumps.

6. A bumping process, comprising:

providing a semiconductor substrate having a plurality of pads disposed on an active surface thereof;

a passivation layer, disposed on the active surface of the semiconductor substrate, having a plurality of openings for exposing the pads;

forming an elastic element on each pad and the passivation layer, wherein each elastic element has an opening, such that a portion of each pad is exposed from the opening of the corresponding elastic element, the elastic elements are separated from each other, and a method of forming the elastic element comprises:

forming a photo-sensitive material on the semiconductor substrate; and patterning the photo-sensitive material via a photolithography process to form the elastic elements respectively;

forming an under bump metallurgic layer on each elastic element, wherein each under bump metallurgic layer is connected to the corresponding pad;

forming a bump on each under bump metallurgic layer, the bump having a flat surface portion on top, wherein a height of the elastic element counting from a top surface of the passivation layer is substantially at least $1/3$ of a height of the bump counting from the top surface of the passivation layer as well; and pressing a rigid substrate on a contact area of the bump, wherein the elastic element ensures the contact area for contacting the rigid substrate by an elastic deformation.

7. The bumping process according to claim 6, wherein a method of forming the bump comprises printing and plating.

8. A wafer structure, comprising:

a semiconductor substrate having an active surface, wherein the semiconductor substrate comprising a plurality of pads disposed on the active surface;

a passivation layer, disposed on the active surface of the semiconductor substrate, having a plurality of openings for exposing the pads;

a plurality of elastic elements disposed on the pads respectively and on the passivation layer, wherein each elastic element has an opening, such that a portion of each pad is exposed from the opening of the corresponding elastic element, and the elastic elements are separated from each other;

a plurality of under bump metallurgic layers covering the elastic elements respectively, wherein each under bump metallurgic layer is connected to the corresponding pad; and a plurality of bumps disposed on the under bump metallurgic layers respectively, wherein the bumps have a height counting from a top surface of the passivation layer, the elastic elements have a height counting from the top surface of the passivation layer as well, and the height of the elastic element is substantially at least $1/3$ of the height of the bumps.

9. The wafer structure of claim 8, wherein the height of the bumps is substantially equal to the height of the elastic element.

10. The wafer structure of claim 8, wherein the bumps are plated bumps or printed bumps, having a substantially flat top surface.

* * * * *